(12) United States Patent
Uda et al.

(10) Patent No.: US 8,716,144 B2
(45) Date of Patent: May 6, 2014

(54) METHOD FOR MANUFACTURING SEMICONDUCTOR DEVICE

(75) Inventors: Shuichiro Uda, Yamanashi (JP); Koji Maruyama, Yamanashi (JP); Yusuke Hirayama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/512,372

(22) PCT Filed: Nov. 17, 2010

(86) PCT No.: PCT/JP2010/070464
§ 371 (c)(1),
(2), (4) Date: May 29, 2012

(87) PCT Pub. No.: WO2011/068029
PCT Pub. Date: Jun. 9, 2011

(65) Prior Publication Data
US 2012/0238098 A1 Sep. 20, 2012

(30) Foreign Application Priority Data

Dec. 1, 2009 (JP) ................................. 2009-273840

(51) Int. Cl.
*H01L 21/302* (2006.01)

(52) U.S. Cl.
USPC ............................ 438/734; 438/735; 438/738

(58) Field of Classification Search
CPC . H01L 21/3065; H01L 21/2236; H01L 21/31; H01L 21/31116; H01L 21/31138; H01L 21/32136; H01L 21/32137; H01L 21/76898
USPC ................... 438/710–714, 734–740
See application file for complete search history.

(56) References Cited

U.S. PATENT DOCUMENTS

| | | | |
|---|---|---|---|
| 5,423,941 A | 6/1995 | Komura et al. | |
| 5,501,893 A | 3/1996 | Laermer et al. | |
| 6,303,513 B1 * | 10/2001 | Khan et al. | 438/714 |
| 6,380,095 B1 * | 4/2002 | Liu et al. | 438/719 |
| 2001/0051439 A1 * | 12/2001 | Khan et al. | 438/710 |
| 2005/0014372 A1 * | 1/2005 | Shimonishi et al. | 438/689 |
| 2006/0063385 A1 | 3/2006 | Maruyama et al. | |
| 2006/0264054 A1 * | 11/2006 | Gutsche et al. | 438/696 |

(Continued)

FOREIGN PATENT DOCUMENTS

| | | |
|---|---|---|
| JP | 6-163478 | 6/1994 |
| JP | 2006-093269 | 4/2006 |
| JP | 2006-156467 | 6/2006 |
| JP | 2007-103876 | 4/2007 |

(Continued)

OTHER PUBLICATIONS

International Search Report mailed on Feb. 1, 2011.

*Primary Examiner* — H Tsai
(74) *Attorney, Agent, or Firm* — IPUSA, PLLC

(57) ABSTRACT

A method for manufacturing a semiconductor device for forming a deep hole in a substrate by using a photoresist film formed on the substrate includes a positioning step of positioning a substrate inside an etching chamber, the substrate having a photoresist film including an opening part formed thereon, a first etching step of performing plasma etching on the substrate positioned inside the etching chamber by using a first mixed gas including at least $SiF_4$ and $O_2$ with the photoresist film as a mask, and a second etching step of forming a hole in the substrate by performing plasma etching on the substrate by using a second mixed gas including at least $SF_6$, $O_2$, and HBr after the first etching step.

4 Claims, 11 Drawing Sheets

(56) References Cited

U.S. PATENT DOCUMENTS

2007/0080136 A1 4/2007 Takata et al.
2007/0131652 A1 6/2007 Okune et al.
2007/0197041 A1 8/2007 Nakaya

FOREIGN PATENT DOCUMENTS

| | | |
|---|---|---|
| JP | 2007-129260 | 5/2007 |
| JP | 2007-220939 | 8/2007 |
| JP | 2009-206130 | 9/2009 |

* cited by examiner

FIG.4
(a)
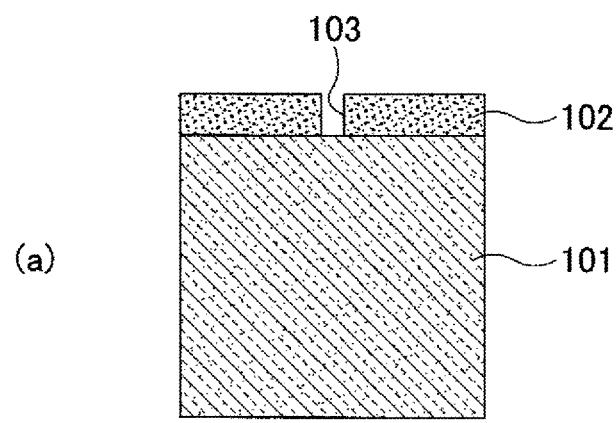
(b)
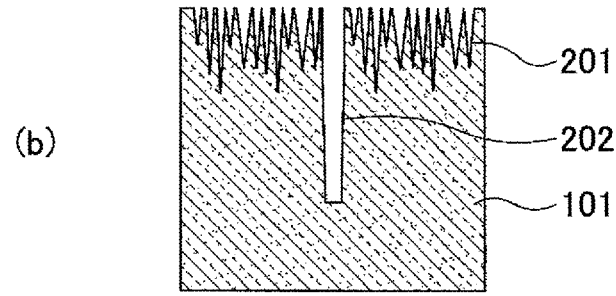

METHOD FOR MANUFACTURING SEMICONDUCTOR DEVICE

TECHNICAL FIELD

The present invention relates to a method for manufacturing a semiconductor device for forming a deep hole in a substrate by plasma etching.

BACKGROUND ART

In recent years, three-dimensional mounting technology is drawing attention as a method for integrating semiconductor devices. As one of the three-dimensional mounting technology, there is a method of three-dimensionally stacking substrates by forming a deep hole in a substrate on which an integrated circuit is formed, stacking such substrates on top of each other in a vertical direction, and forming a wiring with copper or the like inside the deep hole, so that a degree of integration can be increased. In forming the deep hole, the speed and the cost in which the deep hole is formed are important.

One known method forms a deep hole in a substrate by providing a resist pattern having an opening part corresponding to the deep hole (photoresist film including an opening part) on a substrate on which an integrated circuit is formed, and performing plasma etching on the substrate using the resist pattern as a mask. The resist pattern is formed by forming a photoresist film by applying photoresist, and exposing/developing the photoresist film. In a case of etching a substrate on which a photoresist film including an opening part is formed, a deep hole is formed by repeating a step of forming a hole by etching and a step of depositing polymer by polymerization. This method is known as the so-called "bosch process" (see, for example, Patent Document 1). In the etching step, a mixed gas including $SF_6$ gas and Ar gas is used for forming the hole. In the polymerization step, polymer is deposited to an inner wall of the hole and a substrate surface by using a mixed gas including $CHF_3$ gas and Ar gas.

RELATED ART DOCUMENT

Patent Document

PATENT DOCUMENT 1: Japanese Laid-Open Patent Publication No. 2007-129260

DISCLOSURE OF THE INVENTION

Problems to be Solved by the Invention

However, with the bosch process, alternate repeating of the etching step and the polymerization step results in the formation of fine concavities and convexities (referred to as "scalloping") in the sidewall of the deep hole. Due to the formation of the fine concavities and convexities, the coverage rate of the sidewall of the deep hole decreases in a case of forming an insulating film on the sidewall of the deep hole. Thereby, covering property is degraded.

In order to avoid such problems, the use of other processes is being considered. Nevertheless, in a silicon etching process, it is difficult to maintain a sufficient selectivity ratio of a photoresist film. In a case where the selectivity ratio of the photoresist film is insufficient, the photoresist film may be eliminated in a case of forming a deep hole having a depth of approximately several ten μm to several hundred μm. In such a case where the photoresist film is eliminated, a part(s) of a substrate surface besides an opening part may be subjected to etching. This causes the substrate surface to become rough. Further, this causes the diameter of the deep hole to become narrow the closer toward the bottom of the deep hole. As a result, a deep hole having a satisfactory shape cannot be formed in the substrate.

In the bosch process, the etching step and the polymerization step are alternately repeated with almost an equal length of time. Accordingly, almost half the time of the bosch process is spent on the polymerization step. Thus, there is a problem in which the average etching rate relative to the entire bosch process is low.

Hence, in view of the above, it is an object of an embodiment of the present invention to provide a method for manufacturing a semiconductor device by forming a photoresist film as a mask on the substrate and etching the substrate, so that a hole (e.g., deep hole) having a satisfactory shape can be formed in the substrate with a high etching rate and a high selectivity ratio.

Means of Solving the Problems

In order to solve the foregoing problems, an embodiment of the present invention provides a method for manufacturing a semiconductor device including a positioning step of positioning a substrate inside an etching chamber, the substrate having a photoresist film including an opening part formed thereon, a first etching step of performing plasma etching on the substrate positioned inside the etching chamber by using a first mixed gas including at least $SiF_4$ and $O_2$ with the photoresist film as a mask, and a second etching step of forming a hole in the substrate by performing plasma etching on the substrate by using a second mixed gas including at least $SF_6$, $O_2$, and HBr after the first etching step.

Effects of the Invention

According to a method for manufacturing a semiconductor device according to an embodiment of the present invention, a hole (e.g., deep hole) having a satisfactory shape can be formed in a substrate with a high etching rate and a high selectivity ratio by using a photoresist film provided on the substrate as a mask.

BRIEF DESCRIPTION OF DRAWINGS

FIG. 4 is a schematic cross-sectional view illustrating a structure of a substrate corresponding to each step in a case where Step S13 is omitted;

MODE FOR CARRYING OUT THE INVENTION

Next, a method for manufacturing a semiconductor device according to an embodiment(s) of the present invention is described.

First, a method for manufacturing a semiconductor device according to a first embodiment of the present invention is described with reference to FIGS. 1 to 5.

Figure 1:
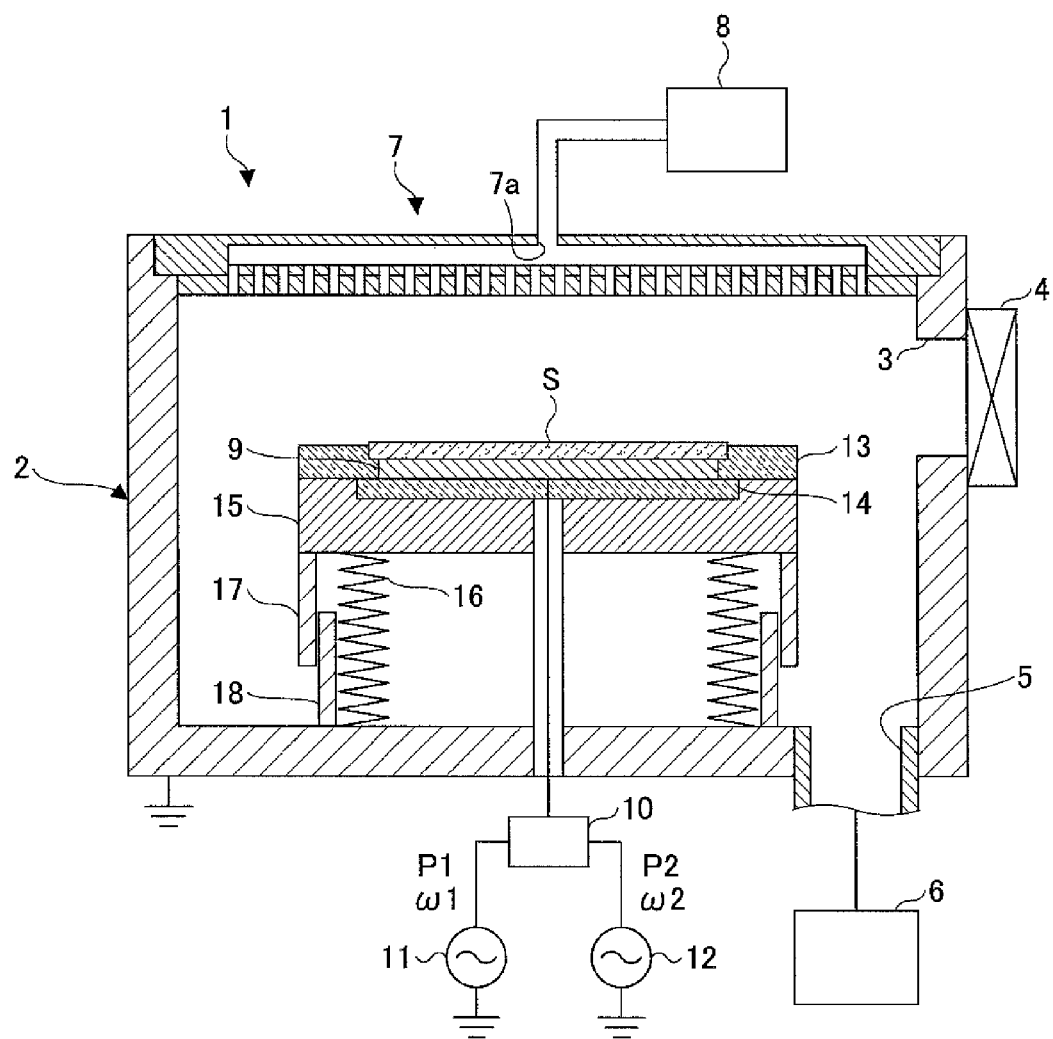
FIG. 1 is a schematic cross-sectional view illustrating a structure of a plasma etching apparatus.

A plasma etching apparatus used for performing the method for manufacturing a semiconductor device according to an embodiment of the present invention is described with reference to FIG. 1. FIG. 1 is a schematic cross-sectional view illustrating a configuration of the plasma etching apparatus.

As illustrated in FIG. 1, a plasma etching apparatus 1 includes a process chamber 2. The process chamber 2 is formed of aluminum in which, for example, an aluminum oxide film is formed on its surface by performing an anodic oxidization process. In addition, the process chamber 2 is grounded. A transfer opening 3 is provided on a side surface of the process chamber 2 for transferring a substrate in and out of the process chamber 2. The inside of the process chamber 2 is maintained in a hermetically sealed state by a gate valve 4 provided outside of the transfer opening 3. An evacuation port 5 is provided at a bottom surface of the process chamber 2. An external vacuum pump 6 is connected to the evacuation port 5. The vacuum pump 6 evacuates the inside of the process chamber 2 via the evacuation port 5. An upper electrode 7 is provided on a top surface of the process chamber 2. The upper electrode 7 is also a shower plate for supplying gas. Further, a supply port 7a is also provided on the top surface of the process chamber 2. A gas supply source 8 is connected to the supply port 7a. The gas supply source 8 supplies, for example, a gas used for plasma etching via the supply port 7a.

It is to be noted that the process chamber 2 corresponds to an etching chamber according to an embodiment of the present invention.

A lower electrode 9 is provided inside the process chamber 2. A substrate (process target) S such as a semiconductor wafer is to be mounted on the lower electrode 9. The lower electrode 9 is connected to a first high frequency power source 11 and a second high frequency power source 12 via a matching device 10. An electrostatic chuck electrode (not illustrated) connected to a high voltage direct current power source (not illustrated) is provided at an inner lower part of a mount surface of the lower electrode 9. A focus ring 13 formed of quartz is provided in a manner encompassing the substrate S and the lower electrode 9. An insulating member 14 formed of ceramic or the like is provided on a bottom surface of the lower electrode 9. The lower electrode 9 is supported by a retaining member 15 and a bellows 16. The lower electrode 9 can be vertically moved by a driving unit (not illustrated). The bellows 16, which can vertically move, is isolated from a plasma atmosphere inside the process chamber 2 by a cover member 17 extending downward from the retaining member 15 and a cover member 18 extending upward from a bottom surface of the process chamber 2 at an outer side of the bellows 16.

It is to be noted that the lower electrode 9 is included in a mounting table according to an embodiment of the present invention. Further, mounting the substrate S on the lower electrode 9 is equivalent to mounting a substrate to an etching chamber according to an embodiment of the present invention.

Next, an operation of the plasma etching apparatus is described with reference to FIG. 1.

The substrate S having a photoresist film (including the below-described opening part) provided as a mask is transferred into the process chamber 2 of the plasma etching apparatus 1 from the transfer opening 3 and mounted on the lower electrode 9. After the substrate S is mounted, a high voltage direct current power source (not illustrated) is turned on, so that the substrate S is fixed on the lower electrode 9 by electrostatic charge. After the process chamber 2 is evacuated by the vacuum pump 6 via the evacuation port 5 in this state, process gas is guided into the process chamber 2 from the gas supply source 8 via the shower plate 7.

A mixed gas having $SiF_4$ gas or HBr gas added to $SF_6$ gas and $O_2$ gas may be used as the process gas. The flow rate of the process gas may be combination in which, for example, $SF_6$ gas ranges from 50 to 150 sccm, $O_2$ gas ranges from 60 to 200 sccm, $SiF_4$ gas ranges from 200 to 1000 sccm, and HBr gas ranges from 20-200 sccm.

In a state where the process gas is set to a predetermined flow rate and the substrate S and the inside of the process chamber 2 are set to a predetermined temperature by a temperature adjustment mechanism (not illustrated), the pressure inside the process chamber 2 is set to a predetermined value. Further, first high frequency power P1 having a first frequency $\omega1$ is supplied from the first high frequency power source 11 to the lower electrode 9 via the matching device 10. Further, second high frequency power P2 having a second frequency $\omega2$ is supplied from the second high frequency power source 12 to the lower electrode 9 via the matching device 10.

The first high frequency $\omega1$ is 100 MHz and the second high frequency $\omega2$ is 13.56 MHz. Although each of the frequencies is not fixed, it is preferable to use at least one power source having a frequency greater than or equal to 40 MHz for controlling self bias voltage.

Figure 2:
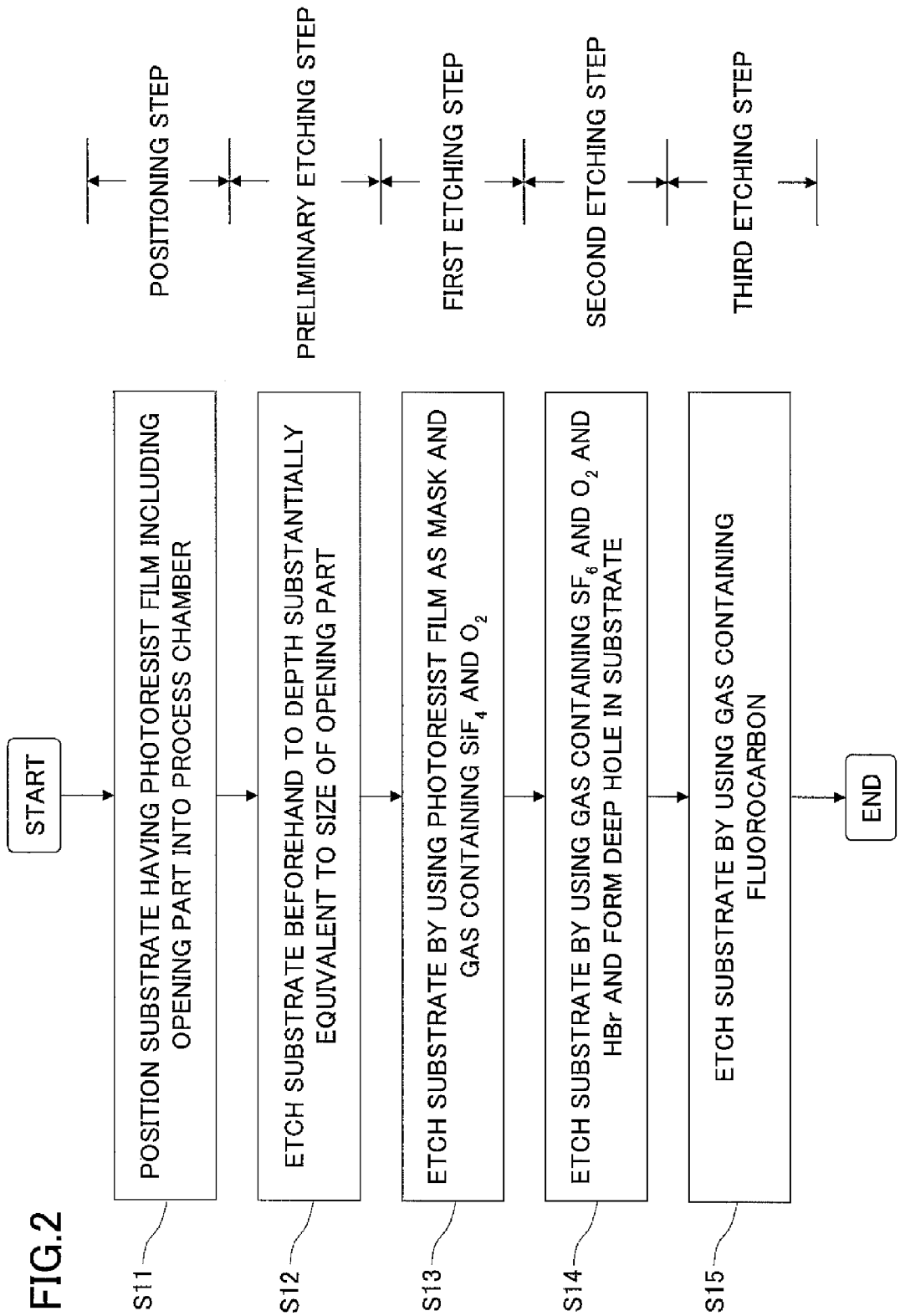
FIG. 2 is a flowchart for describing each of the steps of a method for manufacturing a semiconductor device according to a first embodiment of the present invention.
Figure 3:
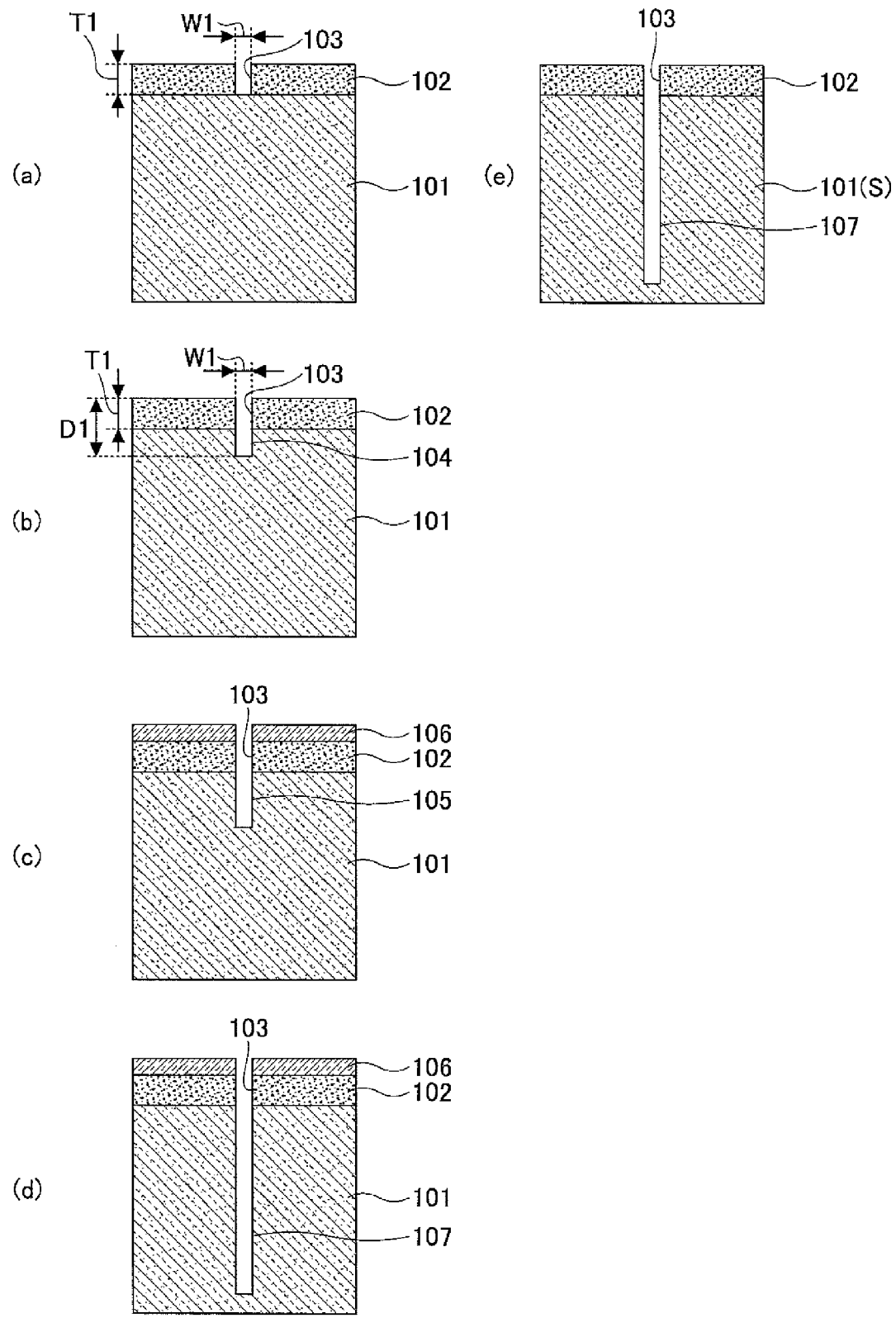
FIG. 3 is a schematic cross-sectional view illustrating a structure of a substrate for each of the steps of the method for manufacturing a semiconductor device according to the first embodiment of the present invention.

Next, a method for manufacturing a semiconductor device according to an embodiment of the present invention is described with reference to FIGS. 2 and 3. FIG. 2 is a flowchart for describing each of the steps of the method for manufacturing a semiconductor device according to an embodiment of the present invention. FIG. 3 is a schematic cross-sectional view illustrating a structure of a substrate for each of the steps of the method for manufacturing a semiconductor device according to an embodiment of the present invention.

As illustrated in FIG. 2, the method for manufacturing a semiconductor device according to an embodiment of the present invention includes a positioning step (Step S11), a preliminary etching step (Step S12), a first etching step (Step S13), a second etching step (Step S14), and a third etching step (Step S15).

First, a positioning step of Step S11 is performed. In Step S11, a substrate 101 (same as the substrate S illustrated in FIG. 1), which has a photoresist film 102 (including an opening part 103) formed thereon, is positioned inside a process chamber 2. FIG. 3(a) illustrates a structure of the substrate after performing Step S11.

For example, as illustrated in FIG. 3(a), a semiconductor wafer formed of single-crystal silicon and having a diameter of 300 mm is used as the substrate 101. Further, a photoresist film 102 is formed on a surface of the substrate 101 beforehand. The photoresist film 102, which is patterned by a photolithography process, includes an opening part 103 used for formation of a deep hole. Commonly, the deep hole has a circular cross-section in a plan view and is formed having a diameter of, for example, approximately 2-20 μm. In such a case, the opening part 103 is also formed having a shape matching the deep hole from a plan view. In some cases, an anti-reflection film or a silicon oxide film (for protection of the semiconductor device when completed) may be formed between the photoresist film 102 and the substrate 101 according to necessity. However, even in such a case, the photoresist film 102 is to be the outermost surface and is to be used as a mask against plasma.

In the case where the opening part has a circular cross-section in a plan view, the below-described "opening width W1" indicates the diameter of the circular opening part.

Then, etching of the substrate 101 is performed by using the photoresist film 102 as a mask. In this embodiment, the etching is performed in multiple steps (Steps S12-S15).

First, a preliminary etching step of Step S12 is performed. In Step S12, a hole 104 is formed by performing plasma etching on the substrate 101 from a top surface of the photoresist film 102 until reaching a depth D1 substantially equivalent to the opening width W1 of the opening part 103. FIG. 3(b) illustrates a structure of the substrate after performing the Step S12.

The substrate 101 having the photoresist film 102 including the opening part 103 is etched by using a mixed gas including $SF_6$, $O_2$, $SiF_4$, and HBr (hereinafter also indicated as "mixed gas including $SF_6/O_2/SiF_4/HBr$") under a condition where the substrate 101 is supplied with a low self-bias voltage. The flow rate of the gas is set to, for example, 60 sccm for $SF_6$, 120 sccm for $O_2$, 600 sccm for $SiF_4$, and 50 sccm HBr. The pressure inside the process. chamber 2 is set to, for example, 20.1 Pa (equivalent to 150 m Torr). The first high frequency power P1 of the first frequency ω1 is set to 1100 W. The second high frequency power P2 of the second frequency ω2 is 50 W. The proportion of the gas, the pressure, and the power may be adaptively changed according to the desired etch shape or the etching rate. Under these conditions, etching is performed for 30-90 seconds. In this case, the substrate temperature is set to approximately 10-60° C., so that the substrate temperature is lower than the inner wall of the process chamber 2. Further, the etching rate achieved by the above-described conditions is, for example, 5-15 μm/min.

In a case where the aspect ratio T1/W1 (which is the ratio of the depth T1 of the opening part 103 relative to the opening width W1 of the opening part 103 of the photoresist film 102) is small, a thin film including silicon oxide would be formed even on the surface of the substrate 101 at the bottom of the opening part 103. Here, the depth T1 of the opening part 103 is the same as the thickness of the photoresist film 102. If a thin film including silicon oxide is formed on the surface of the substrate 101 at the bottom of the opening part 103, etching of the substrate 101 performed afterwards would be adversely affected by the thin film.

On the other hand, according to an embodiment of the present invention, the substrate 101 is etched to a small degree beforehand in Step S12, so that the hole 104 is formed. Thereby, the aspect ratio D1/W1 (which is the ratio of the depth D1 of the hole 104 from the top surface of the photoresist film 102 relative to the opening width W1 of the opening part 103 of the photoresist film 102) is large. Accordingly, the apparent aspect ratio of the opening part 103 can be increased. Thus, the thin film including silicon oxide can be prevented from adhering to the bottom of the opening part 103.

More specifically, the hole 104 is etched from at least the top surface of the photoresist film 102 until reaching a depth D1 that is substantially equal to the opening width W1 of the opening part 103. The aspect ratio D1/W1 of the depth D1 with respect to the width W1 of the hole 104 (indicated as W1 by being substantially equal to the opening width of the opening part 103) can be greater than or equal to 1.

Then, the first etching step is performed in Step S13. In Step S13, plasma etching is performed on the substrate 101 by using a first mixed gas including at least $SiF_4$ and $O_2$ where the photoresist film 102 is used as a mask. Further, plasma etching is performed in a condition where the self bias voltage applied to the substrate 101 is controlled to a low bias. FIG. 3(c) illustrates a structure of the substrate after performing the Step S13.

More specifically, in Step S13, plasma etching is performed with a first mixed gas including $SF_6$, $O_2$, and $SiF_4$ (hereinafter also indicated as "first mixed gas including $SF_6/O_2/SiF_4$") on the substrate 101 having the opening 104 formed by the plasma etching (until reaching the depth D1 that is substantially equal to the opening width W1 of the opening part 103) of Step S12. Further, plasma etching is performed in a condition where the self bias voltage applied to the substrate 101 is controlled to a low bias. In this case, a thin film 106 including silicon oxide is formed on the surface of the photoresist film 102. The flow rate of the gas is set to 60 sccm for $SF_6$, 120 sccm for $O_2$, and 600 sccm for $SiF_4$. The pressure inside the process chamber 2 is set to 20.1 Pa (equivalent to 150 m Torr). Further, the self bias voltage Vdc applied to the substrate 101 mounted on the lower electrode 9 is controlled to a low bias condition of 50 V or less. In order to satisfy the low bias condition, the first high frequency power P1 of the first frequency ω1 is set to approximately 1100 W and the second high frequency power P2 of the second frequency ω2 is set to approximately 50 W or less. In this step also, the proportion of the gas, the pressure, and the power may be adaptively changed according to the desired etch shape or the etching rate. Under these conditions, etching is performed for 30-120 seconds. In this case, the substrate temperature is set to approximately 10-60° C., so that the substrate temperature is lower than the inner wall of the process chamber 2. Further, the etching rate achieved by the above-described conditions is, for example, 3-10 μm/min.

The self-bias voltage Vdc of the substrate 101 is set to 50 V or less for protecting the photoresist film 102 from plasma. In a case where the self-bias voltage Vdc of the substrate 101 becomes greater than 50 V, the photoresist film 102 may be damaged or removed by plasma. Accordingly, in Step S13, the first high frequency power P1 of the first frequency ω1 and the second high frequency power P2 of the second frequency ω2 are adjusted so that the self-bias voltage of the substrate 101 becomes 50 V or less. Alternatively, if other process conditions (e.g., substrate temperature) can provide protection of the photoresist film 102 from plasma, the self-bias voltage of the substrate 101 may be greater than 50 V.

As a result, as illustrated in FIG. 3(c), a hole 105 is formed in the substrate 101 via the opening part 103 by further etching the hole 104 in a depth direction. In addition, the thin film 106 including silicon oxide and having a thickness of approximately 100 nm is deposited on the surface of the photoresist film 102. The deposition rate of the thin film 106 is, for example, 0.1-0.5 μm/min.

Then, a second etching step is performed in Step S14. Following Step S13, plasma etching is performed on the substrate 101 by using a second mixed gas including at least $SF_6$, $O_2$, and HBr in Step S14. Thereby, a deep hole 107 is formed in the substrate 101. FIG. 3(d) illustrates a structure of the substrate after performing Step S14.

More specifically, following the first etching step of Step S13, plasma etching is performed in Step 514 by further adding HBr to the first mixed gas including $SF_6/O_2/SiF_4$ and using a second mixed gas including $SF_6/O_2/SiF_4/HBr$ in a state where the substrate 101 is mounted on the lower electrode 9 inside the process chamber 2. The flow rate of the gas is set to 60 sccm for $SF_6$, 120 sccm for $O_2$, 600 sccm for $SiF_4$, and 50 sccm for HBr, The pressure inside the process chamber 2 is set to 20.1 Pa (equivalent to 150 m Torr). The first high frequency power P1 of the first frequency ω1 is set to approximately 1200 W and the second high frequency power P2 of the second frequency ω2 is set to approximately 80 W. In this step also, the proportion of the gas, the pressure, and the power may be adaptively changed according to the desired etch shape or the etching rate.

Under these conditions, etching is performed for, for example, 5 minutes. In this case, the substrate temperature is set to approximately 10-60° C., so that the substrate temperature is lower than the inner wall of the process chamber 2. Further, the etching rate achieved by the above-described conditions is, for example, 5-15 μm/min.

As a result, as illustrated in FIG. 3(d), the deep hole 107 having a depth of approximately 50-100 μm is formed in the substrate 101 with the photoresist film 102 still remaining thereon. As described below, the thin film 106 including silicon oxide (formed on the surface of the photoresist film 102 in Step S13) is used as a so-called hard mask when performing the etching using the gas including HBr in Step S14. As a result, the deep hole 107 can be formed and the photoresist film 102 can be protected from plasma.

It is to be noted that the term "deep hole" according to an embodiment of the present invention may correspond to "hole" of the present invention. Further, a "deep hole" may be a deep hole having a depth of approximately several ten μm to several hundred μm. Next, with reference to FIG. 4, it is described why a deep hole having a satisfactory shape cannot be formed in a case where Step S13 is omitted. FIG. 4 is a schematic cross-sectional view illustrating a structure of a substrate corresponding to each step in a case where Step S13 is omitted.

FIG. 4(a) illustrates a structure of the substrate after performing Step S11. It is the same as the structure of FIG. 3(a). Further, because Step S12 is for preventing a thin film containing silicon oxide from being formed in the bottom of the opening part 103 in Step S13, Step S12 is omitted along with the omission of Step S13.

FIG. 4(b) illustrates a structure of the substrate after performing Step S14 in a case where Steps S12 and S13 are omitted. As illustrated in FIG. 4(b), the photoresist film 102 is completely eliminated by etching. As a result, fine holes 201 are formed throughout the entire surface of the substrate 101. The shape of the deep hole 202 becomes narrower toward the bottom. Therefore, a deep hole having a desired shape cannot be obtained by omitting Step S13 (and Step S12).

After performing Step S14, a third etching step is performed in Step S15. In Step S15, plasma etching is performed by using a gas including fluorocarbon under a low bias condition. FIG. 3(e) illustrates a structure of the substrate after performing Step S15.

More specifically, following the second etching step of Step S14, plasma etching is performed by using a gas containing fluorocarbon (e.g., $CF_4$) in a state where the substrate 101 is mounted on the lower electrode 9 inside the process chamber 2 in Step S15. The flow rate of the gas is set to 100 sccm. The pressure inside the process chamber 2 is set to 20.1 Pa (equivalent to 150 m Torr). The first high frequency power P1 of the first frequency ω1 is set to approximately 500 W and the second high frequency power P2 of the second frequency ω2 is set to approximately 300 W. Under these conditions, etching is performed for 1 minute.

As a result, as illustrated in FIG. 3(e), the thin film 106 including silicon oxide (formed on the surface of the photoresist film 102) can be removed. By adding Step S15, the step of removing the photoresist film 102 in a subsequent step can be simplified.

Figure 5:
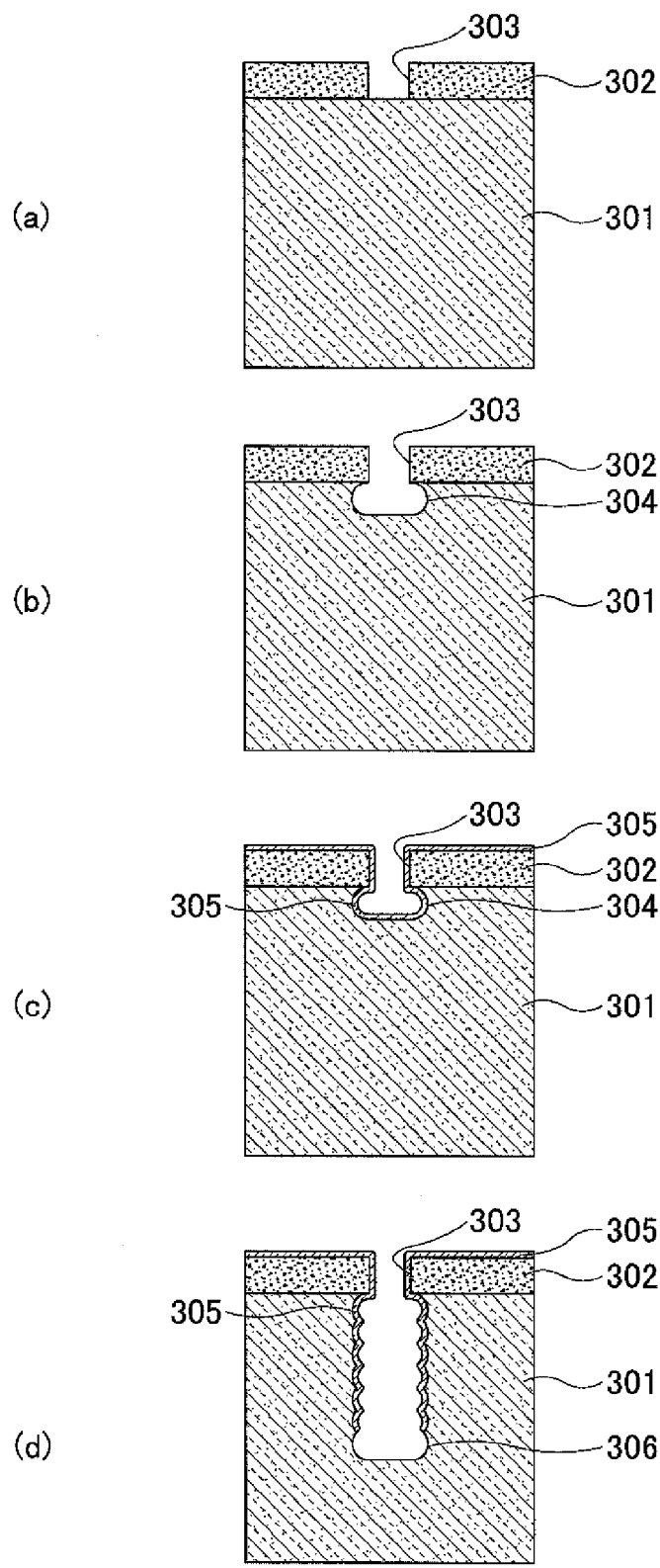
FIG. 5 is a schematic cross-sectional view illustrating a structure of a substrate corresponding to each step when performing a Bosch process.

Next, a method for manufacturing a semiconductor device according to an embodiment of the present invention is described with reference to FIG. 5. Further, the following describes how the method for manufacturing a semiconductor device according to an embodiment of the present invention can use a photoresist film on a substrate and form a deep hole having a satisfactory shape with a high etching rate and a high selectivity ratio in comparison with a bosch process. FIG. 5 is a schematic cross-sectional view illustrating a structure of a substrate corresponding to each step when performing the bosch process.

In a case of etching a substrate 301 having a photoresist film 302 including an opening part 303 formed thereon (see FIG. 5(a)) in the bosch process, a deep hole 306 (see FIG. 5(d)) is formed by alternately repeating an etching step and a polymerization step. In the etching step, the substrate 301 is etched by using a mixed gas including $SF_6$ gas and Ar gas; thereby, forming a hole 304 illustrated in FIG. 5(b). In the polymerization step, a polymer 305 is adhered to an inner wall of the hole 304 and a surface of the substrate 301 (surface of photoresist film 302) by using a mixed gas including $CHF_3$ gas and Ar gas as illustrated in FIG. 5(c).

However, by repeating the etching step and the polymerization step in the bosch process, alternate repeating of the etching step and the polymerization step results in the formation of fine concavities and convexities (referred to as "scalloping") in the sidewall of the deep hole 306. Due to the formation of the fine concavities and convexities, the coverage rate of the sidewall of the deep hole 306 decreases in a case of forming an insulating film on the sidewall of the deep hole 306. Thereby, covering property is degraded.

In a case of using a process other than the bosch process where the photoresist film is used as a mask for etching a substrate, the selectivity ratio (ratio between the rate of etching a substrate and the rate of etching a photoresist film) is approximately 10-20. Accordingly, the photoresist film could be eliminated by the time of forming a deep hole having a depth of approximately several ten μm to several hundred μm.

On the other hand, according to an embodiment of the present invention, plasma etching is performed on a part of the substrate 101 at the bottom of the opening part 103 by using a first mixed gas including at least $SiF_4$ and $O_2$ in the first etching process, and the thin film 106 including silicon oxide is formed on the surface of the photoresist film 102. Further, in a case of performing the second etching step using the second mixed gas including HBr following the first etching process, the thin film 106 including silicon oxide (formed in the first etching step) serves as a so-called hard mask. Accordingly, even in a case of performing plasma etching by using the second mixed gas including HBr, the photoresist film 102 is protected from plasma. Thus, the selectivity ratio (ratio between the rate of etching a substrate and the rate of etching a photoresist film) can be increased. Accordingly, the photoresist film 102 can be prevented from being eliminated during the period of forming the deep hole 107 in the substrate 101. Thus, the deep hole 107 can be formed having a desired depth.

Further, according to an embodiment of the present invention, because the thin film 106 including silicon oxide serves as a hard mask, there is no need to alternately repeat the etching step and the polymerization step as with the bosch process. Accordingly, the generation of scalloping as with the bosch process can be prevented. Thus, the deep hole 107 can be formed having a satisfactory shape.

Further, because the etching step and the polymerization step (which require substantially the same amount of time) are alternately repeated in the bosch process, the proportion of the time spent in the etching step is approximately half of the entire processing time. On the other hand, according to an embodiment of the present invention, the first etching step, which is equivalent to the polymerization step of the bosch process, need only be performed once. Further, the ratio between the length of time of the first etching step and the length of time of the second etching step (equivalent to the etching step of the bosch step) is, for example, approximately 1:10. Therefore, according to an embodiment of the present invention, the proportion of the time of the etching step with respect to the entire processing time can be, for example, approximately 10/11. Thus, the proportion of the time of the etching step with respect to the entire processing time can be increased. In other words, compared to the bosch process, the forming of, for example, a deep hole in a substrate can be performed at a higher etching rate.

Further, the polymerization step (in which a fluorocarbon (CF) type gas such as $CHF_3$ is deposited) of the bosch process is not performed according to an embodiment of the present invention. Accordingly, the characteristics of a semiconductor device can be prevented from being degraded by, for example, foreign matter adhering to a sidewall of a deep hole.

Although the method for manufacturing a semiconductor device according to the above-described embodiment of the present invention is performed by using a plasma etching apparatus that superimposes high frequencies to a lower electrode, other plasma etching apparatuses may be used. For example, an ICP plasma apparatus may be used. Nevertheless, it is preferable for the frequency of the high frequency power to be greater than or equal to 40 MHz in a case of using an apparatus capable of supplying high frequency power to the lower electrode because the plasma process is to be performed with a low bias.

Next, a method for manufacturing a semiconductor device according to a second embodiment of the present invention is described with reference to FIGS. 6 and 7.

Figure 6:
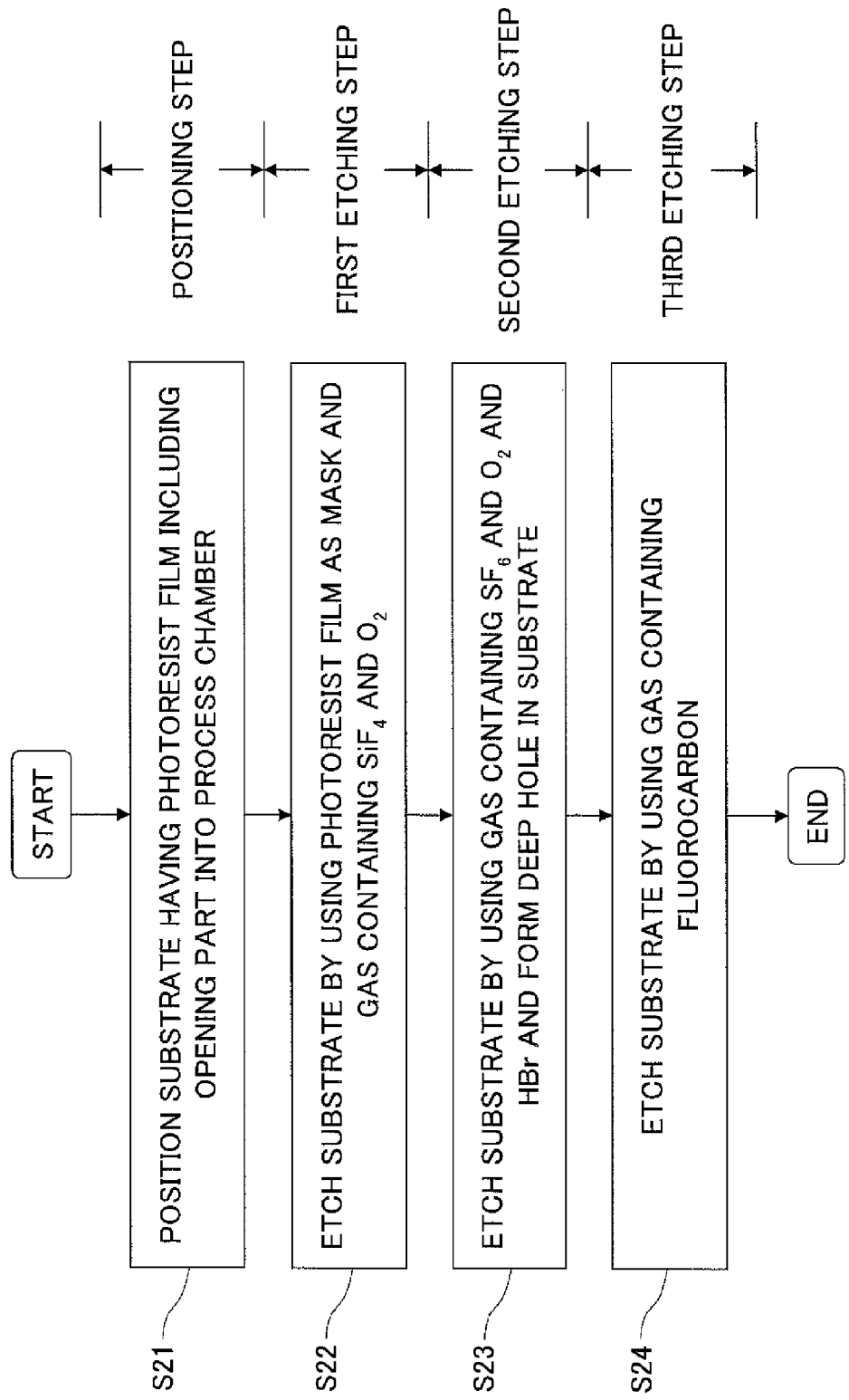
FIG. 6 is a flowchart for describing each of the steps of a method for manufacturing a semiconductor device according to a second embodiment of the present invention.
Figure 7:
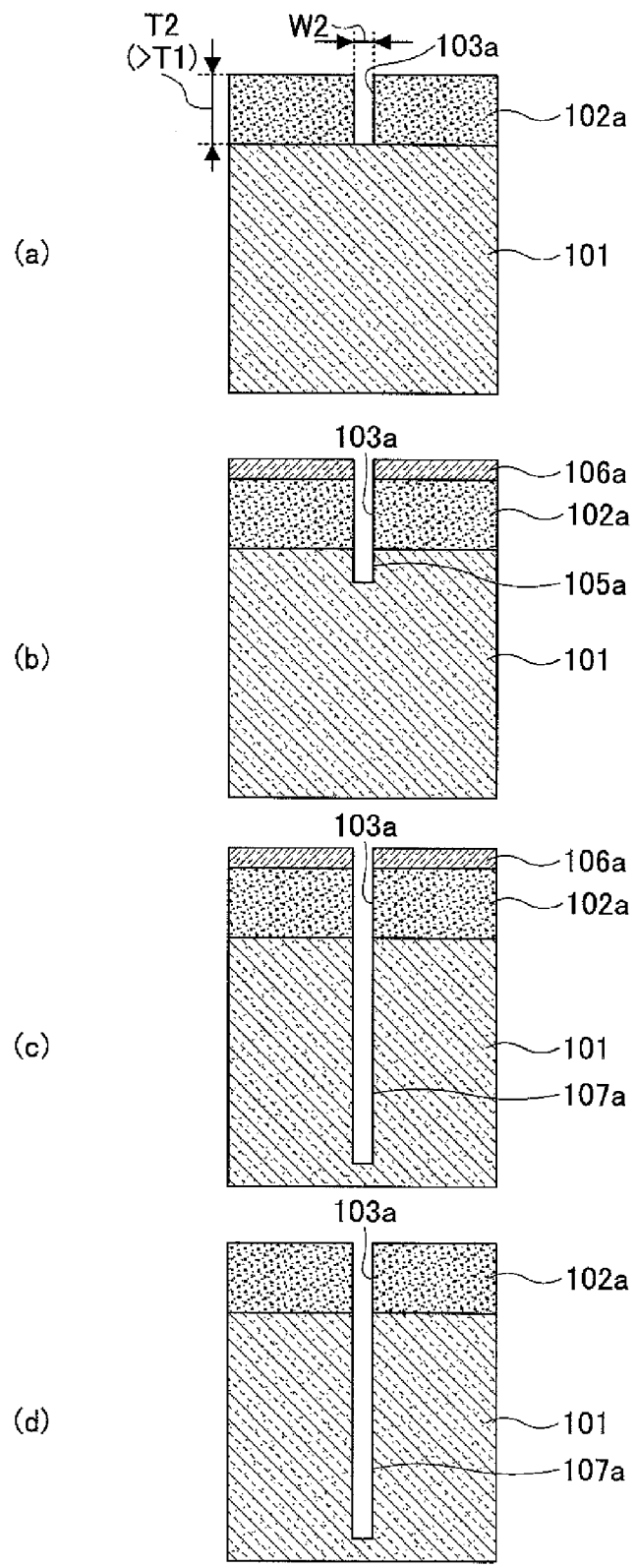
FIG. 7 is a schematic cross-sectional view illustrating a structure of a substrate for each of the steps of the method for manufacturing a semiconductor device according to the second embodiment of the present invention.

FIG. 6 is a flowchart for describing each of the steps of the method for manufacturing a semiconductor device according to an embodiment of the present invention. FIG. 7 is a schematic cross-sectional view illustrating a structure of a substrate for each of the steps of the method for manufacturing a semiconductor device according to an embodiment of the present invention. It is to be noted that, in the following, like components are denoted with like reference numerals as of those of the above-described embodiment and are not further described.

In the method for manufacturing a semiconductor device according to this embodiment, the preliminary etching step (Step S12) of the first embodiment is not performed.

As illustrated in FIG. 6, the method for manufacturing a semiconductor device according to an embodiment of the present invention includes a positioning step (Step S21), a first etching step (Step S22), a second etching step (Step S23), and a third etching step (Step S24).

First, a positioning step is performed in Step S21. Step S21 is the same as Step S11 of the first embodiment. FIG. 7(a) illustrates a structure of the substrate after performing Step S21.

However, as described below, the aspect ratio T2/W2 in this embodiment (which is the ratio of a thickness T2 of a photoresist film 102a relative to an opening width W2 of an opening part 103a) is increased to, for example, 1. Although different depending on the opening width W2 of the opening part 103a, the thickness T2 of the photoresist film 102a is set greater than the thickness T1 of the first embodiment in a case where, for example, the opening width W2 of the opening part 103a is equal to the opening width W1 of the first embodiment.

Then, the first etching step is performed in Step S22. In Step S22, plasma etching is performed on the substrate 101 by using a first mixed gas including at least $SiF_4$ and $O_2$ where the photoresist film 102a is used as a mask. Further, plasma etching is performed in a condition where the self bias voltage applied to the substrate 101 is controlled to a low bias. FIG. 7(b) illustrates a structure of the substrate after performing Step S22.

More specifically, in Step S22, etching is performed with a first mixed gas including $SF_6/O_2/SiF_4$ on the substrate 101 in a condition where the self bias voltage applied to the substrate 101 is controlled to a low bias. At the same time, a thin film 106a including silicon oxide is formed on the surface of the photoresist film 102a. The flow rate of the gas is set to 60 sccm for $SF_6$, 120 sccm for $O_2$, and 600 sccm for $SiF_4$. The pressure inside the process chamber 2 is set to 20.1 Pa (equivalent to 150 m Torr). Further, the self bias voltage Vdc applied to the substrate 101 mounted on the lower electrode 9 is controlled to a low bias condition of 50 V or less. In order to satisfy the low bias condition, the first high frequency power P1 of the first frequency ω1 is set to approximately 1100 W and the second high frequency power P2 of the second frequency ω2 is set to approximately 50 W or less. The proportion of the gas, the pressure, and the power may be adaptively changed according to the desired etch shape or the etching rate. Under these conditions, etching is performed for 30-90 seconds. In this case, the substrate temperature is set to approximately 10-60° C., so that the substrate temperature is lower than the inner wall of the process chamber 2. Further, the etching rate achieved by the above-described conditions is, for example, 3-10 μm/min.

Similar to the first embodiment, the self-bias voltage Vdc of the substrate 101 is set to 50 V or less for protecting the photoresist film 102a from plasma. Alternatively, if other process conditions (e.g., substrate temperature) can provide protection of the photoresist film 102a from plasma, the self-bias voltage of the substrate 101 may be greater than 50 V.

Because the preliminary etching step is not performed in this embodiment, no hole is formed in the substrate 101 before Step S22. However, the aspect ratio T2/W2 (which is the ratio of the thickness T2 of the photoresist film 102a relative to the opening width W2 of the opening part 103a) is increased to, for example, 1. Therefore, in a case of forming a thin film 106a including silicon oxide on a surface of the photoresist film 102a, a thin film including silicon oxide can be prevented from being formed on a surface of the substrate 101 at the bottom of the opening part 103a.

Alternatively, by adjusting the first high frequency power P1 of the first frequency ω1 and the second high frequency power P2 of the second frequency ω2, the deposition rate of the thin film 106a including silicon oxide may be increased. With this method, a thin film including silicon oxide can be prevented from being formed on a surface of the substrate 101 at the bottom of the opening part 103a.

As a result, as illustrated in FIG. 7(b), a hole 105a is formed in the substrate 101 via the opening part 103a. In addition, the thin film 106a including silicon oxide and having a thickness of approximately 100 nm is deposited on the surface of the photoresist film 102a. The rate (deposition rate) in which of the thin film 106a is deposited is, for example, 0.1-0.5 μm/min.

The photoresist film 102a illustrated in FIG. 7(b) is depicted as having the same thickness as the thickness T2 of the photoresist film 102a illustrated in FIG. 7(a). However, depending on the processing conditions of Step S22, the surface of the photoresist film 102a may be etched in a manner that the thickness of the photoresist film 102a illustrated in FIG. 7(b) is less than the thickness T2 of the photoresist film 102a illustrated in FIG. 7(a).

Then, a second etching step is performed in Step S23 and a third etching step is performed in Step S24. Steps S23 and S24 are the same as Steps S14 and S15 of the first embodiment. FIGS. 7(c) and 7(d) illustrate a structure of the substrate after performing Steps S23 and S24, respectively.

Similar to the first embodiment, the term "deep hole" according to this embodiment of the present invention may correspond to "hole" of the present invention. Further, a "deep hole" may be a deep hole having a depth of approximately several ten μm to several hundred μm.

In this embodiment also, a thin film including silicon oxide (formed in the first etching step) serves as a hard mask in the subsequent second etching step. Accordingly, the generation of scalloping as with the bosch process can be prevented. Thus, a deep hole can be formed having a satisfactory shape. Thus, the proportion of the time of the etching step with respect to the entire processing time can be increased. Hence, in this embodiment also, a hole (e.g., deep hole) having a satisfactory shape can be formed in a substrate with a high etching rate and a high selectivity ratio by using a photoresist film provided on the substrate as a mask.

In addition, with this embodiment, the preliminary etching step can be omitted either by increasing the aspect ratio of an opening part of a photoresist film to approximately 1 or adjusting the processing conditions. Accordingly, the steps for forming a hole (e.g., deep hole) using a photoresist film provided on the substrate as a mask can be simplified.

Next, a method for manufacturing a semiconductor device according to a third embodiment of the present invention is described with reference to FIGS. 8. and 9.

Figure 8:
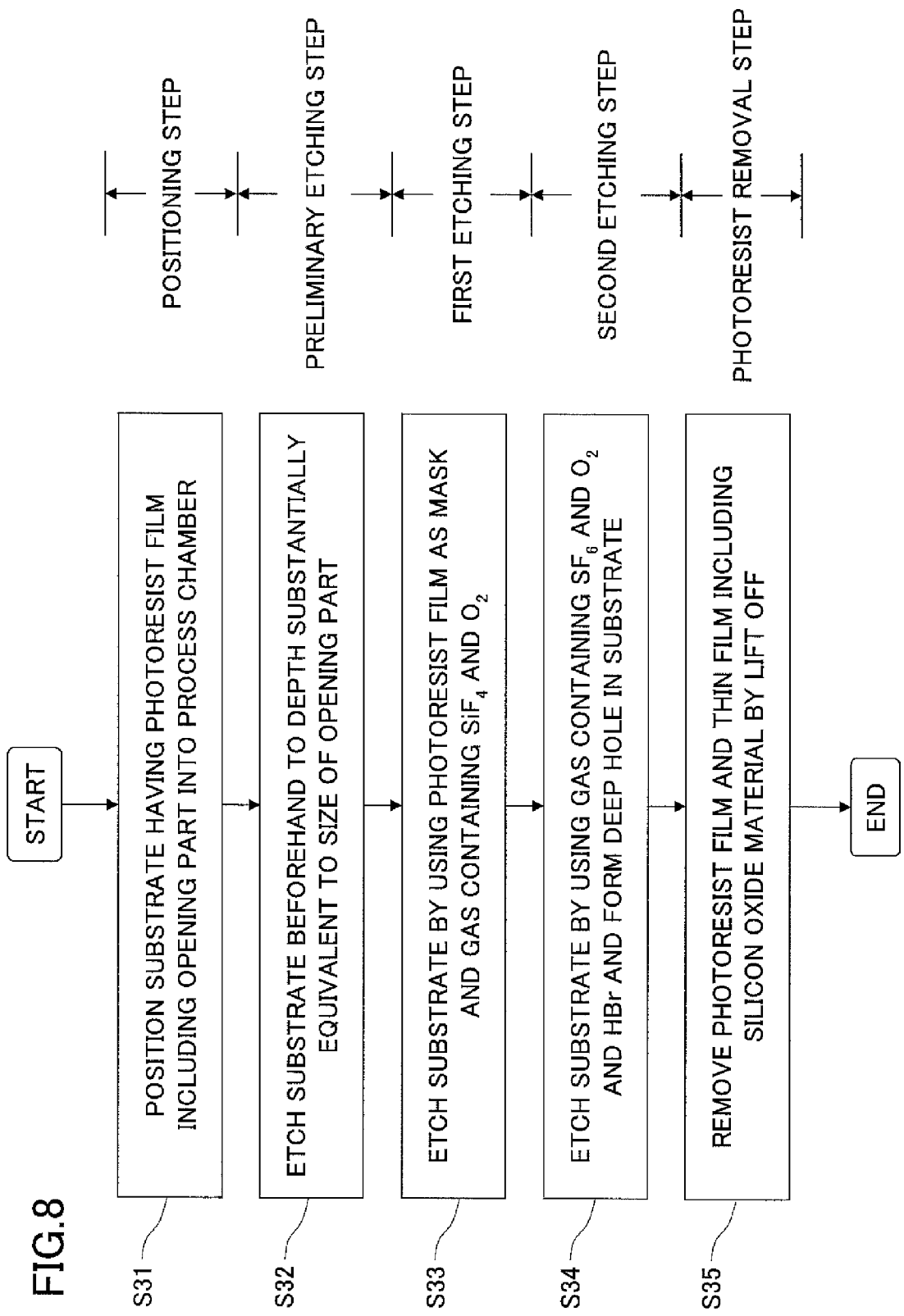
FIG. 8 is a flowchart for describing each of the steps of the method for manufacturing a semiconductor device according to a third embodiment of the present invention.
Figure 9:
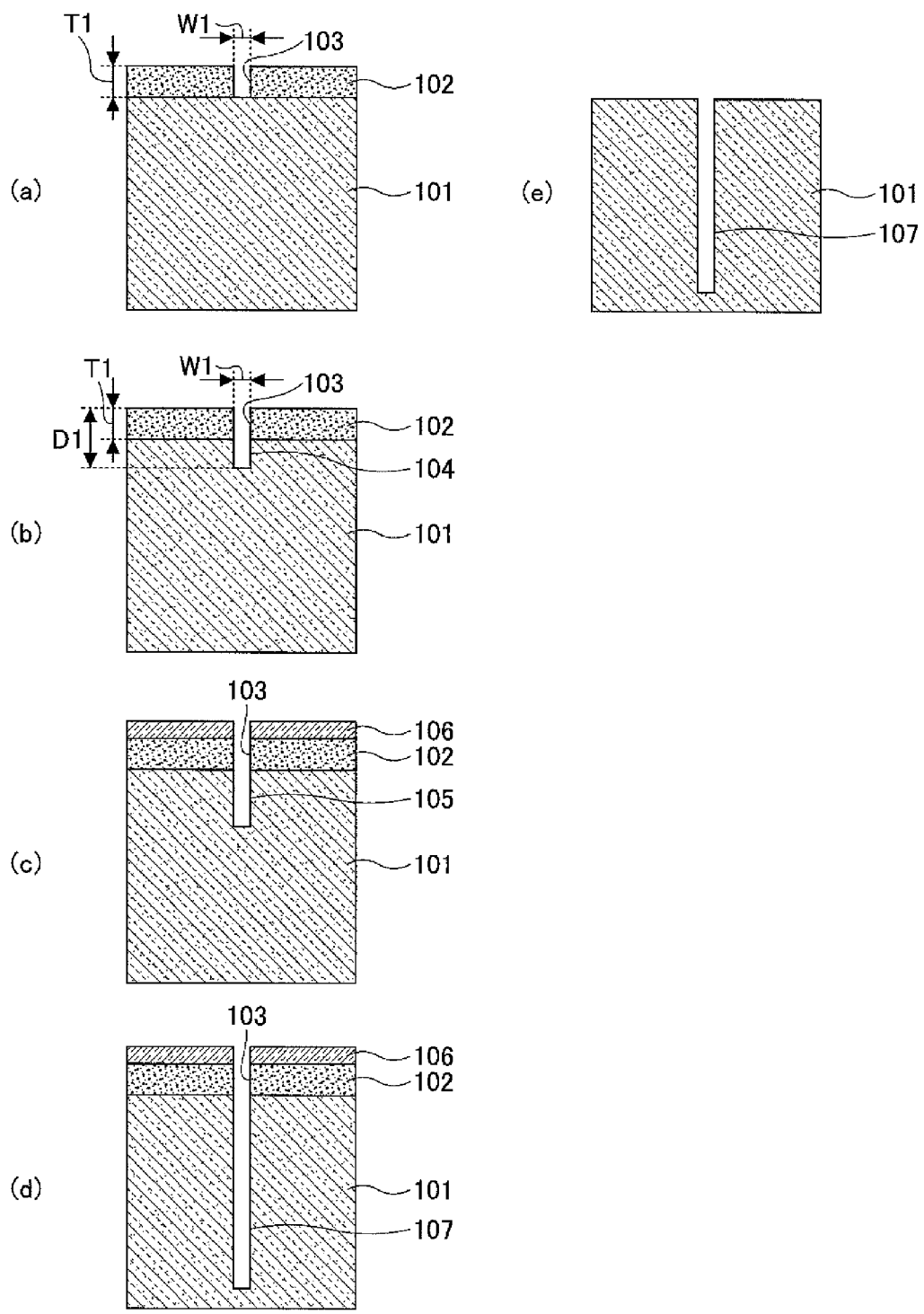
FIG. 9 is a schematic cross-sectional view illustrating a structure of a substrate for each of the steps of the method for manufacturing a semiconductor device according to the third embodiment of the present invention.

FIG. 8 is a flowchart for describing each of the steps of the method for manufacturing a semiconductor device according to an embodiment of the present invention. FIG. 9 is a schematic cross-sectional view illustrating a structure of a substrate for each of the steps of the method for manufacturing a semiconductor device according to an embodiment of the present invention.

In the method for manufacturing a semiconductor device according to this embodiment, a photoresist removing step is performed instead of the third etching step (Step S15) of the first embodiment.

As illustrated in FIG. 8, the method for manufacturing a semiconductor device according to an embodiment of the present invention includes a positioning step (Step S31), a preliminary etching step (Step S32), a first etching step (Step S33), a second etching step (Step S34), and a photoresist removing step (Step S35).

First, steps S31 to S34 (positioning step to second etching step) are performed. Steps S31-S34 are the same as Steps S11-S14 of the first embodiment. FIGS. 9(a) to 9(d) illustrate a structure of the substrate after performing each of Steps S31-S34, respectively.

Similar to the first embodiment, the term "deep hole" according to this embodiment of the present invention may correspond to "hole" of the present invention. Further, a "deep hole" may be a deep hole having a depth of approximately several ten μm to several hundred μm.

In this embodiment, a photoresist removing step is performed in Step S35 after performing Step S34. In Step S35, the photoresist film 102 and the thin film 106 including silicon oxide are removed by, for example, lift-off. FIG. 9(e) illustrate a structure of a substrate after performing the Step S35.

In Step S35, after the deep hole 107 is formed in the substrate 101 by performing Step S34 inside the plasma etching apparatus, the substrate 101 is extracted from the plasma etching apparatus. Then, the photoresist film 102 is removed (melted) either by steeping the substrate 101 in a lift-off solution (e.g., organic solution) or by applying a lift-off solution to the surface of a substrate 101. Thereby, both the photoresist film 102 and the thin film 106 including silicon oxide are removed.

In Step S35, various methods other than lift-off may be used as long as both the photoresist film 102 and the thin film 106 including silicon oxide can be removed.

In this embodiment also, a thin film including silicon oxide (formed in the first etching step) serves as a hard mask in the subsequent second etching step. Accordingly, the generation of scalloping as with the Bosch process can be prevented. Thus, a deep hole can be formed having a satisfactory shape. Thus, the proportion of the time of the etching step with respect to the entire processing time can be increased. Hence, in this embodiment also, a hole (e.g., deep hole) having a satisfactory shape can be formed in a substrate with a high etching rate and a high selectivity ratio by using a photoresist film provided on the substrate as a mask.

In addition, with this embodiment, by removing both a photoresist film and a thin film including silicon oxide using, for example, lift-off, the third etching step can be omitted. Accordingly, the steps for forming a hole (e.g., deep hole) using a photoresist film provided on the substrate as a mask can be simplified.

Next, a method for manufacturing a semiconductor device according to a fourth embodiment of the present invention is described with reference to FIGS. 10 and 11.

Figure 10:
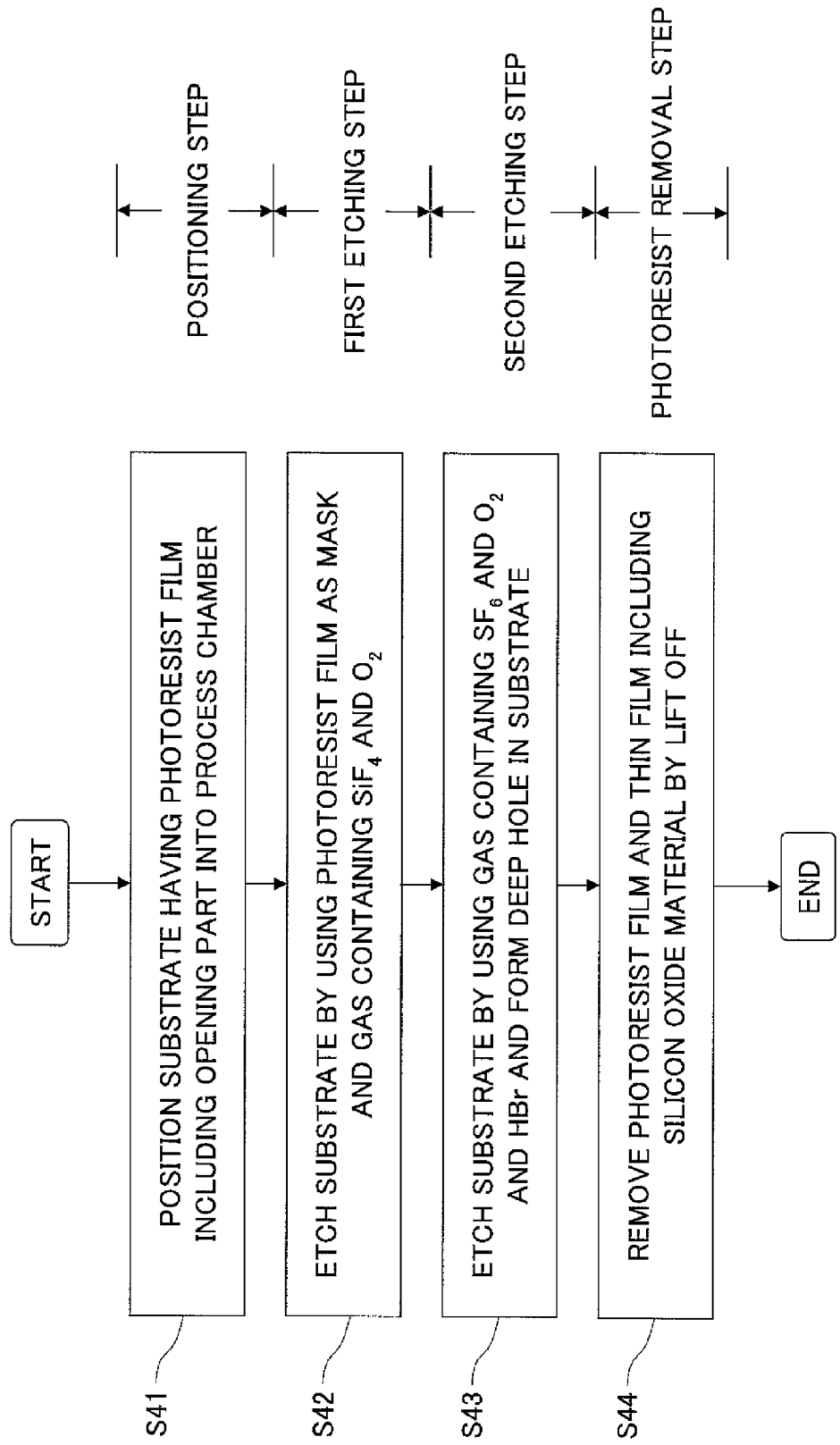
FIG. 10 is a flowchart for describing each of the steps of the method for manufacturing a semiconductor device according to a fourth embodiment of the present invention.
Figure 11:
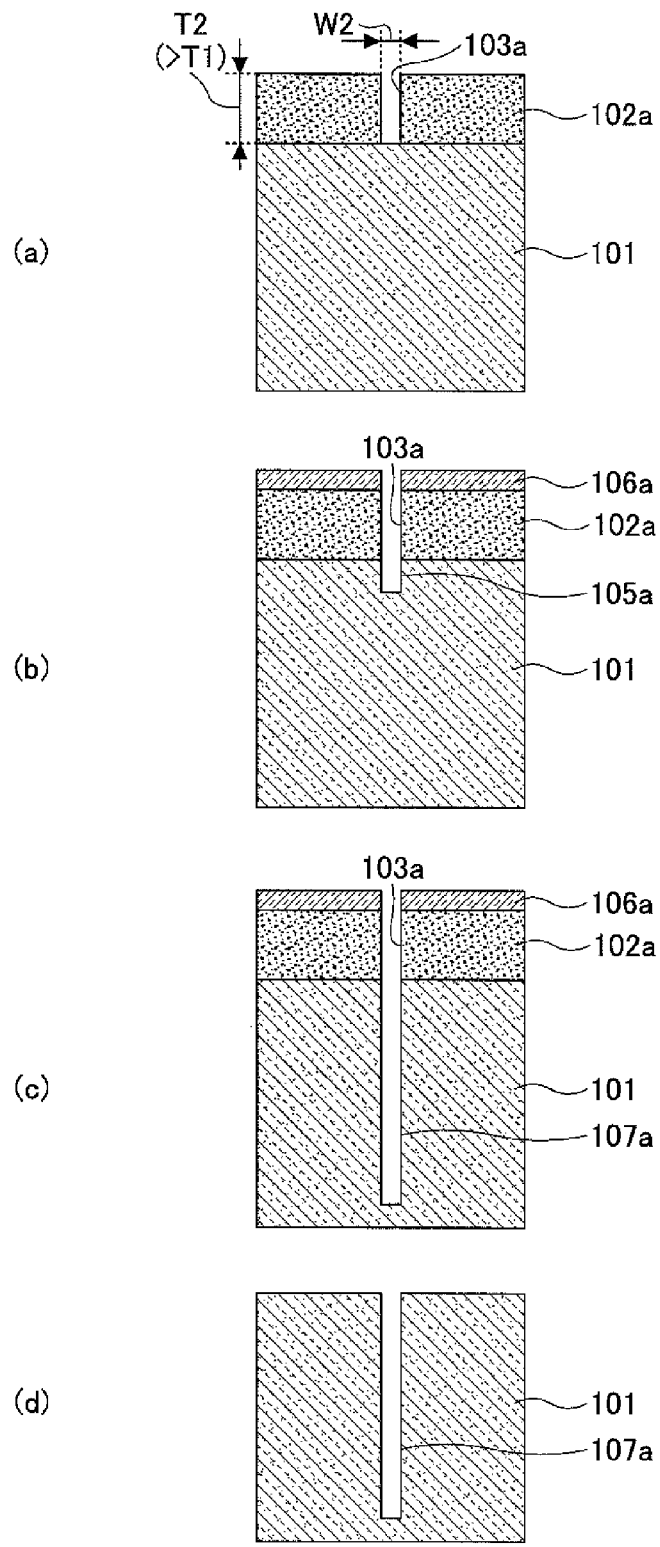
FIG. 11 is a schematic cross-sectional view illustrating a structure of a substrate for each of the steps of the method for manufacturing a semiconductor device according to the fourth embodiment of the present invention.

FIG. 10 is a flowchart for describing each of the steps of the method for manufacturing a semiconductor device according to an embodiment of the present invention. FIG. 11 is a schematic cross-sectional view illustrating a structure of a substrate for each of the steps of the method for manufacturing a semiconductor device according to an embodiment of the present invention.

In the method for manufacturing a semiconductor device according to this embodiment, a photoresist removing step is performed instead of the third etching step (Step S24) of the second embodiment.

As illustrated in FIG. 10, the method for manufacturing a semiconductor device according to an embodiment of the present invention includes a positioning step (Step S41), a first etching step (Step S42), a second etching step (Step S43), and a photoresist removing step (Step 544).

First, steps S41 to S43 (positioning step to second etching step) are performed. Steps S41-S43 are the same as Steps S21-S23 of the second embodiment. FIGS. 11(a) to 11(c) illustrate a structure of the substrate after performing each of Steps S41-S43, respectively.

In this embodiment also, the aspect ratio T2/W2 (which is the ratio of the thickness T2 of the photoresist film 102a relative to the opening width W2 of the opening part 103a) is increased to, for example, 1. Although different depending on the opening width W2 of the opening part 103a, the thickness T2 of the photoresist film 102a is set larger than the thickness T1 of the first embodiment in a case where, for example, the opening width W2 of the opening part 103a is equal to the opening width W1 of the first embodiment. Similar to the first embodiment, the term "deep hole" according to this embodiment of the present invention may correspond to "hole" of the present invention. Further, a "deep hole" may be a deep hole having a depth of approximately several ten gm to several hundred μm.

In this embodiment, a photoresist removing step is performed in Step S44 after performing Step S43. Step S44 is the same as Step S35 of the third embodiment. FIG. 11(d) illustrates a structure of a substrate after performing the Step S44.

In this embodiment also, a thin film including silicon oxide (formed in the first etching step) serves as a hard mask in the subsequent second etching step. Accordingly, the generation of scalloping as with the bosch process can be prevented. Thus, a deep hole can be formed having a satisfactory shape. Thus, the proportion of the time of the etching step with respect to the entire processing time can be increased. Hence, in this embodiment also, a hole (e.g., deep hole) having a satisfactory shape can be formed in a substrate with a high etching rate and a high selectivity ratio by using a photoresist film provided on the substrate as a mask.

In addition, with this embodiment, the preliminary etching step and the third etching step can be omitted. Accordingly, the steps for forming a hole (e.g., deep hole) using a photoresist film provided on the substrate as a mask can be simplified.

Further, the present invention is not limited to these embodiments, but variations and modifications may be made without departing from the scope of the present invention.

The above-described embodiments of the present invention is not only applicable to a case of manufacturing a semiconductor device on a silicon substrate but also applicable to a case of manufacturing a semiconductor device on various substrates such as SOT (Silicon On Insulator).

In the above-described embodiments of the present invention, there is explained a method of manufacturing a semiconductor device where a deep hole having a depth of several ten μm to several hundred μm is formed by etching a substrate.

However, the hole that is formed by etching is not limited to a deep hole. Accordingly, the above-described embodiments of the present invention may be applicable to a case of forming a shallow hole having a depth of approximately less than or equal to several ten μm.

The present international patent application is based on Japanese Priority Application No. 2009-273840 filed on Dec. 1, 2009, with the Japanese Patent Office, the entire contents of which are hereby incorporated by reference.

The invention claimed is:

1. A method for manufacturing a semiconductor device comprising:
    a positioning step of positioning a silicon substrate inside an etching chamber, the silicon substrate having a photoresist film including an opening part formed thereon;
    a first etching step of performing plasma etching on the silicon substrate positioned inside the etching chamber by using a mixed gas including at least $SF_6$, $SiF_4$ and $O_2$ with the photoresist film as a mask; and
    a second etching step of forming a hole in the silicon substrate by performing the plasma etching on the silicon substrate by using a mixed gas including at least $SF_6$, $SiF_4$, $O_2$, and HBr after the first etching step,
    wherein a preliminary etching step of etching the substrate until reaching a depth that is substantially equal to an opening width of the opening part is performed beforehand, prior to the first etching step, said preliminary etching step using a mixed gas including at least $SF_6$, $SiF_4$, $O_2$, and HBr,
    wherein during said first etching step, a thin film including silicon dioxide is deposited on a surface of the photoresist film, and
    wherein flow rates of the $SF_6$, $SiF_4$, and $O_2$, are not changed in said preliminary etching step, said first etching step, and said second etching step.

2. The method for manufacturing a semiconductor device as claimed in claim 1, further comprising:
    a third etching step for etching the silicon substrate by using a gas including fluorocarbon after the second etching step.

3. The method for manufacturing a semiconductor device as claimed in claim 2,
    wherein the silicon substrate is mounted on a mount table provided inside the etching chamber in the positioning step,
    wherein the etching is performed in the third etching step under a condition where a self-bias voltage of the silicon substrate mounted on the mount table is less than or equal to 50 V.

4. The method for manufacturing a semiconductor device as claimed in claim 3,
    wherein the etching is performed in the first etching step under a condition where a self-bias voltage of the silicon substrate mounted on the mount table is less than or equal to 50 V.

* * * * *